(12) United States Patent
Moue

(10) Patent No.: US 11,063,604 B2
(45) Date of Patent: Jul. 13, 2021

(54) ANALOG-TO-DIGITAL CONVERTER, SOLID-STATE IMAGING ELEMENT, AND ELECTRONIC EQUIPMENT

(71) Applicant: Sony Semiconductor Solutions Corporation, Kanagawa (JP)

(72) Inventor: Takashi Moue, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/486,195

(22) PCT Filed: Jan. 18, 2018

(86) PCT No.: PCT/JP2018/001335
§ 371 (c)(1),
(2) Date: Aug. 15, 2019

(87) PCT Pub. No.: WO2018/159131
PCT Pub. Date: Sep. 7, 2018

(65) Prior Publication Data
US 2020/0059242 A1    Feb. 20, 2020

(30) Foreign Application Priority Data
Feb. 28, 2017    (JP) .............................. JP2017-036135

(51) Int. Cl.
*H03M 3/00*    (2006.01)
*H04N 5/378*    (2011.01)

(52) U.S. Cl.
CPC ........... *H03M 3/464* (2013.01); *H03M 3/424* (2013.01); *H03M 3/43* (2013.01); *H04N 5/378* (2013.01)

(58) Field of Classification Search
CPC ........ H03M 3/464; H03M 3/424; H03M 3/43; H03M 3/462; H04N 5/378
See application file for complete search history.

(56) References Cited

U.S. PATENT DOCUMENTS 6,628,214 B1    9/2003  Kawase et al.
2002/0145449 A1  10/2002  Rivoir et al.
(Continued)

FOREIGN PATENT DOCUMENTS

EP    1028531 A1    8/2000
JP    2000-078027 A    3/2000
(Continued)

OTHER PUBLICATIONS

International Search Report and English translation thereof dated Mar. 27, 2018 in connection with International Application No. PCT/JP2018/001335.

*Primary Examiner* — Timothy J Henn
(74) *Attorney, Agent, or Firm* — Wolf, Greenfield & Sacks, P.C.

(57) ABSTRACT

An analog-to-digital converter of the present disclosure includes: a ΔΣ modulator including a quantization circuit unit; a splitter that divides a digital output of the quantization circuit unit into an even-numbered digital value and an odd-numbered digital value; two-system transmission paths that transmit the even-numbered digital value and the odd-numbered digital value separately; and
  a digital filter that processes the even-numbered digital value and the odd-numbered digital value transmitted by the two-system transmission paths, and outputs the even-numbered digital value and the odd-numbered digital value as an analog-to-digital conversion value.

20 Claims, 14 Drawing Sheets

(56) References Cited

U.S. PATENT DOCUMENTS

| | | | |
|---|---|---|---|
| 2005/0270212 A1* | 12/2005 | Smith | H03M 1/1028 |
| | | | 341/155 |
| 2006/0092056 A1* | 5/2006 | Hilton | H03M 1/0626 |
| | | | 341/118 |
| 2012/0001782 A1* | 1/2012 | Morita | H03M 3/47 |
| | | | 341/110 |
| 2015/0029876 A1 | 1/2015 | Ogata et al. | |
| 2015/0171884 A1 | 6/2015 | Tsukuda et al. | |
| 2016/0182845 A1 | 6/2016 | Hagihara | |
| 2018/0270438 A1* | 9/2018 | Niwa | H04N 5/369 |

FOREIGN PATENT DOCUMENTS

| | | |
|---|---|---|
| JP | 2003-008442 A | 1/2003 |
| JP | 2003-188713 A | 7/2003 |
| JP | 2012-165088 A | 8/2012 |
| JP | 2015-026986 A | 2/2015 |
| JP | 2015-053648 A | 3/2015 |
| JP | 2015-115907 A | 6/2015 |
| WO | WO 2011/089859 A1 | 7/2011 |

* cited by examiner

AT TIME OF SMALL INPUT : 0 0 1 0 0 0 1 0 0 0 0 1 0 0

AT TIME OF MIDDLE INPUT : 0 1 0 1 0 1 0 1 0 1 1 0 1 0

AT TIME OF LARGE INPUT : 1 1 0 1 1 1 1 0 1 1 1 0 1 1

AT TIME OF SMALL INPUT [EVEN NUMBER] : 0 1 0 1 0 0 0
[ODD NUMBER] : 0 0 0 0 0 1 0

AT TIME OF MIDDLE INPUT [EVEN NUMBER] : 0 0 0 0 0 1 1
[ODD NUMBER] : 1 1 1 1 1 0 0

AT TIME OF LARGE INPUT [EVEN NUMBER] : 1 0 1 1 1 1 1
[ODD NUMBER] : 1 1 1 0 1 0 1

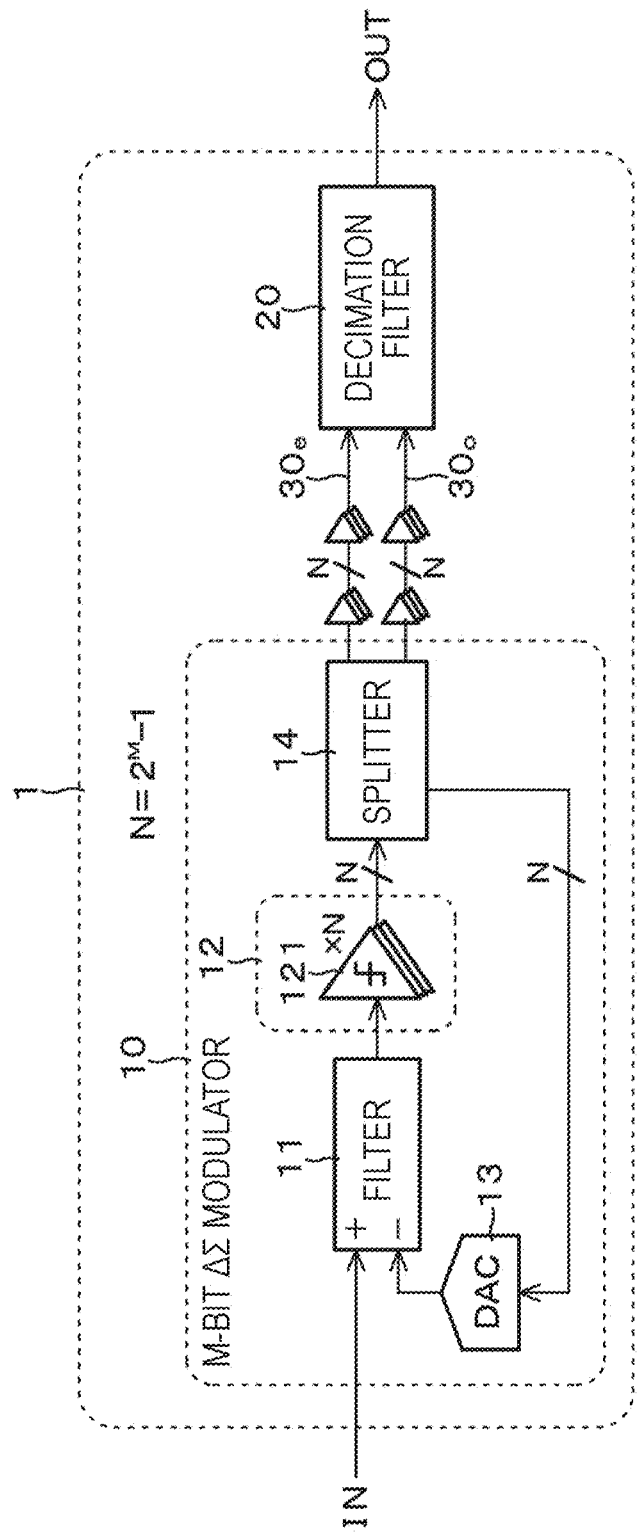

ANALOG-TO-DIGITAL CONVERTER, SOLID-STATE IMAGING ELEMENT, AND ELECTRONIC EQUIPMENT

CROSS-REFERENCE TO RELATED APPLICATIONS

This application claims the benefit under 35 U.S.C. § 371 as a U.S. National Stage Entry of International Application No. PCT/JP2018/001335, filed in the Japanese Patent Office as a Receiving Office on Jan. 18, 2018, which claims priority to Japanese Patent Application Number JP2017-036135, filed in the Japanese Patent Office on Feb. 28, 2017, each of which is hereby incorporated by reference in its entirety.

TECHNICAL FIELD

The present disclosure relates to an analog-to-digital converter, a solid-state imaging element, and electronic equipment.

BACKGROUND ART

As one analog-to-digital converter (AD converter), for example, a ΔΣ analog-to-digital converter is known (see, for example, Patent Document 1). The ΔΣ analog-to-digital converter includes a ΔΣ modulator and a digital filter, which is called a decimation filter. The ΔΣ modulator converts a direct current signal or a low-frequency input signal into a low-resolution (1 bit to a few bits), high-sampling-rate digital signal. The decimation filter converts the low-resolution, high-sampling-rate digital signal output from the ΔΣ modulator into a high-resolution, low-sampling-rate analog-to-digital conversion value.

CITATION LIST

Patent Document

Patent Document 1: Japanese Patent Application Laid-Open No. 2012-165088

SUMMARY OF THE INVENTION

Problems to be Solved by the Invention

By the way, the ΔΣ modulator and the decimation filter are normally arranged adjacently. However, for layout reasons, the ΔΣ modulator and the decimation filter are arranged at a distance and a transmission path that links them is long in some cases. In this case, the number of electric charges to be charged or discharged with respect to parasitic capacitance is increased, and in a case where a repeater is arranged, its flow-through current is increased, resulting in an increase in power consumed in the transmission path.

Thus, it is an object of the present disclosure to provide an analog-to-digital converter that can reduce the power consumption, a solid-state imaging element that uses the analog-to-digital converter, and electronic equipment including the solid-state imaging element.

Solutions to Problems

An analog-to-digital converter of the present disclosure for achieving the aforementioned object includes:

a ΔΣ modulator including a quantization circuit unit; a splitter that divides a digital output of the quantization circuit unit into an even-numbered digital value and an odd-numbered digital value;

two-system transmission paths that transmit the even-numbered digital value and the odd-numbered digital value separately; and a digital filter that processes the even-numbered digital value and the odd-numbered digital value transmitted by the two-system transmission paths, and outputs the even-numbered digital value and the odd-numbered digital value as an analog-to-digital conversion value.

A solid-state imaging element of the present disclosure for achieving the aforementioned object includes:

a pixel array unit including unit pixels including a photoelectric conversion unit arranged in a row and column pattern; and a column processing unit including an analog-to-digital converter that converts an analog pixel signal output from the unit pixel into a digital pixel signal, and, as the analog-to-digital converter, uses the analog-to-digital converter having the configuration described above. Furthermore, electronic equipment of the present disclosure for achieving the aforementioned object includes the solid-state imaging element having the configuration described above.

When the digital data of the quantization circuit unit is divided into the even-numbered digital value and the odd-numbered digital value, and they are separately transmitted by the two-system transmission paths, the rate of change of digital data from 0 to 1 or 1 to 0 in each of the two-system transmission paths from the ΔΣ modulator to the digital filter is reduced. Thus, the power consumption is reduced.

Effects of the Invention

According to the present disclosure, it is possible to reduce power consumption because a rate of change of digital data from 0 to 1 or 1 to 0 is reduced in a transmission path from a ΔΣ modulator to a digital filter. Note that effects described herein are not necessarily limited, but may also be any of those described in the present description. Furthermore, the effects described in the present description are merely illustrative and not limited to the effects, and additional effects may be provided.

BRIEF DESCRIPTION OF DRAWINGS

FIG. 5 is a block diagram illustrating a circuit configuration of a ΔΣ analog-to-digital converter according to Example 2.

MODE FOR CARRYING OUT THE INVENTION

Aspects for carrying out the technology of the present disclosure (hereinafter, the "embodiments") are described below in conjunction with the drawings. The technology of the present disclosure is not limited to the embodiments, and various numerical numbers or the like of the embodiments are illustrative. In the following description, the same symbol is used for the same elements or elements having the same function, and a redundant description is omitted. Note that the description is provided in the order set forth below.

1. Description related to analog-to-digital converter, solid-state imaging element, electronic equipment, and general matters of the present disclosure.

2. Analog-to-digital converter of the present disclosure 2-1. Basic form (example of one transmission path)

2-2. Example 1 (example of case having 1-bit ΔΣ modulator)

2-3. Example 2 (example of case having multi-bit ΔΣ modulator)

2-4. Example 3 (variation of Example 1: Specific Circuit Example 1 of splitter)

2-5. Example 4 (variation of Example 1: Specific Circuit Example 2 of splitter)

3. Solid-state imaging element of the present disclosure (example of CMOS image sensor)

3-1. Basic system configuration 3-2. Layered structure

4. Electronic equipment of the present disclosure (example of imaging apparatus)

5. Configuration that can be adopted by the present disclosure

<Description Related to Analog-to-Digital Converter, Solid-State Imaging Element, Electronic Equipment, and General Matters of the Present Disclosure>

For the analog-to-digital converter, the solid-state imaging element, and the electronic equipment of the present disclosure, the ΔΣ modulator may be configured as a 1-bit ΔΣ modulator. Alternatively, the ΔΣ modulator may be configured as a multi-bit ΔΣ modulator.

For the analog-to-digital converter, the solid-state imaging element, and the electronic equipment of the present disclosure including the aforementioned preferable configuration, a splitter may be configured using a D-flip flop. Alternatively, the splitter may be configured using an RS-flip flop. Furthermore, it may be configured by combining an even-numbered digital value and an odd-numbered digital value to feed back to an input side via a digital-to-analog conversion unit.

<Analog-to-Digital Converter of the Present Disclosure>

The analog-to-digital converter (AD converter) of the present disclosure is an ΔΣ analog-to-digital converter using a ΔΣ modulator that converts a direct current signal or a low-frequency input signal into a low-resolution (1 bit to a few bits), high-sampling-rate digital signal. The ΔΣ analog-to-digital converter includes a digital filter, which is called a decimation filter, at a stage after the ΔΣ modulator. The decimation filter converts the low-resolution, high-sampling-rate digital signal output from the ΔΣ modulator into a high-resolution, low-sampling-rate analog-to-digital conversion value.

[Basic Form]

Figure 1:
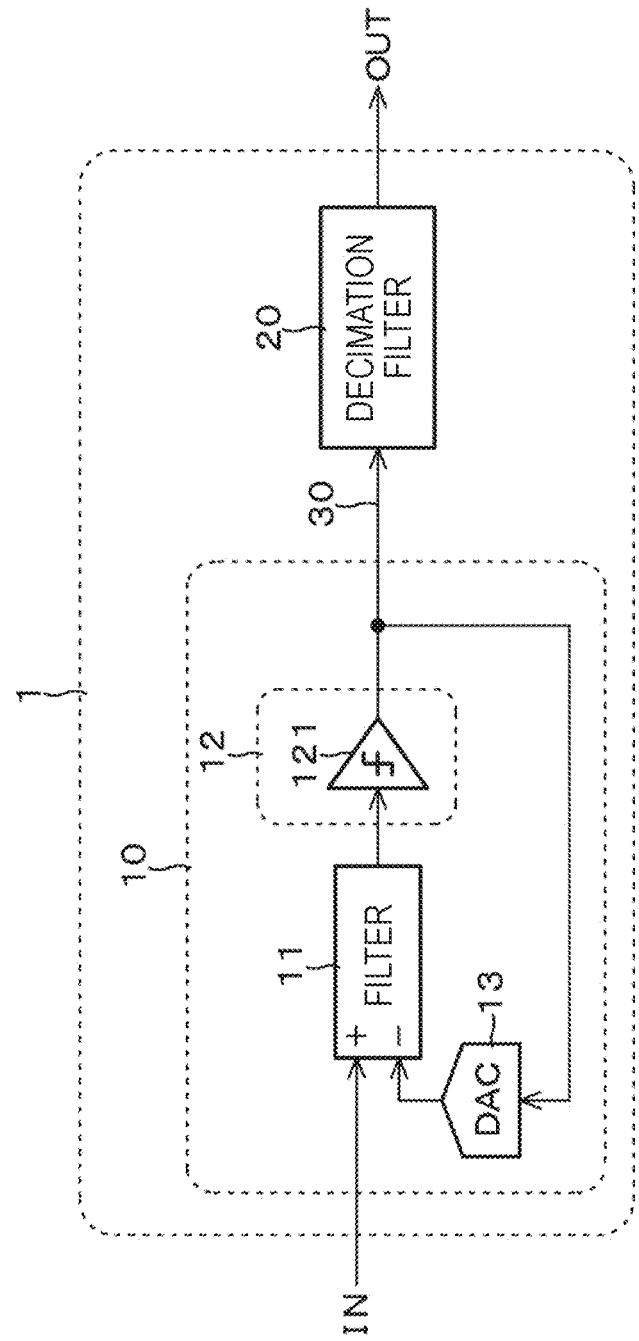
FIG. 1 is a block diagram illustrating a basic form of a ΔΣ analog-to-digital converter.

First, a basic form of the ΔΣ analog-to-digital converter is described in conjunction with FIG. 1. FIG. 1 is a block diagram illustrating a basic form of a ΔΣ analog-to-digital converter. The ΔΣ analog-to-digital converter according to the basic form is also a ΔΣ analog-to-digital converter according to a conventional example of the present disclosure.

As illustrated in FIG. 1, the ΔΣ analog-to-digital converter 1 according to the basic form includes a ΔΣ modulator 10 and a decimation filter 20, which is an example of the digital filter, and is configured such that the ΔΣ modulator 10 and the decimation filter 20 are connected by one transmission path 30. The ΔΣ modulator 10 converts a direct current signal or a low-frequency input signal IN into a low-resolution (1 bit to a few bits), high-sampling-rate digital signal. The decimation filter 20 converts the low-resolution, high-sampling-rate digital signal output from the ΔΣ modulator 10 into a high-resolution, low-sampling-rate analog-to-digital conversion value OUT, and outputs the high-resolution, low-sampling-rate analog-to-digital conversion value OUT.

The ΔΣ modulator 10 and the decimation filter 20 are described in more detail below.

The ΔΣ modulator 10 includes a filter 11, a quantization circuit unit 12, and a digital-to-analog conversion unit (DA converter) 13. The filter 11 includes an integration circuit in which an analog input signal IN is a non-inverted (+) input, a feedback value from the digital-to-analog conversion unit 13 is an inverted (−) input, and a difference between the value of the analog input signal IN and the feedback is integrated. The quantization circuit unit 12 includes, for example, a comparator 121, and quantizes an output of the filter 11 in comparison with a reference voltage (determines a digital value of logic "1" or logic "0"), and outputs the quantized output as, for example, a 1-bit digital signal.

The digital signal output from the quantization circuit unit 12 is fed to the digital-to-analog conversion unit 13 and is fed to the decimation filter 20 via the transmission path 30. The digital-to-analog conversion unit 13 generates a feedback value corresponding to the digital signal output from the quantization circuit unit 12, and feeds the feedback value to the filter 11 as an inversion input. The decimation filter 20 performs processing of removing quantization noise generated by the ΔΣ modulator 10 and reducing a sampling frequency by thinning (decimation), and performs outputting as a digital signal OUT.

As described above, the ΔΣ modulator 10 causes the quantization noise injected at the quantization circuit unit 12 to be unevenly distributed in a high frequency range by the work of feedback loop including the digital-to-analog conversion unit 13, and performs output. Then, the decimation filter 20 removes a high frequency quantization noise generated in the ΔΣ modulator 10 and obtain high resolution. This series of processing is a basic principle of the ΔΣ analog-to-digital converter 1.

A lot of quantization noise unevenly distributed in high frequency is included. Therefore, the output of the ΔΣ modulator 10 is digital data in which logic "0" and logic "1" are frequently switched in the 1-bit ΔΣ modulator (the density of logic "1" output substantially corresponds to input level). Furthermore, also in the multi-bit ΔΣ modulator, when attention is drawn to each output path in the multi-bit ΔΣ modulator, those in which logic "0" and logic "1" are frequently switched depending on input level are present.

Normally, the ΔΣ modulator 10 and the decimation filter 20 are arranged adjacently. However, for layout reasons or the like, the ΔΣ modulator 10 and the decimation filter 20 are arranged at a distance in some cases. In such a case, a transmission path 30 that links the ΔΣ modulator 10 and the decimation filter 20 is long, resulting in an increase in power consumed in the transmission path 30. The cause of an increase in power consumption is an increase in the number of electric charges to be charged or discharged with respect to parasitic capacitance of the transmission path 30. Furthermore, in a case where a repeater is arranged in the transmission path 30, the power consumption is increased by an increase in its flow-through current.

Thus, the present embodiment is made to reduce the power consumed in the transmission path 30, in particular, in a case where the length of the transmission path 30 that links the ΔΣ modulator 10 and the decimation filter 20, i.e., the transmission path 30 that transmits digital data from the ΔΣ modulator 10 to the decimation filter 20, becomes long. A specific example of the ΔΣ analog-to-digital converter 1 according to the present invention for reducing the power consumption even in a case where the length of the transmission path 30 that links the ΔΣ modulator 10 and the decimation filter 20 is long is described below.

Example 1

Figure 2:
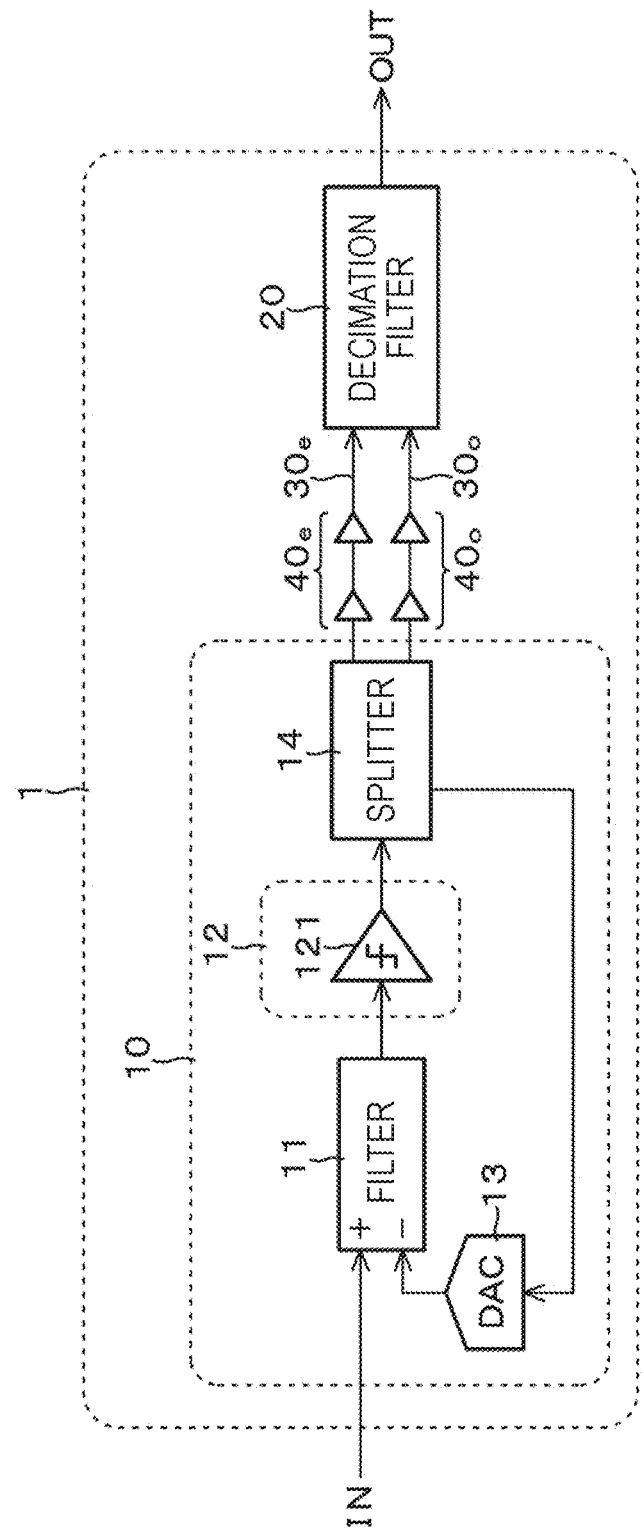
FIG. 2 is a block diagram illustrating a circuit configuration of a ΔΣ analog-to-digital converter according to Example 1.

Example 1 is an example of a case of having a 1-bit ΔΣ modulator. FIG. 2 is a block diagram illustrating a circuit configuration of the ΔΣ analog-to-digital converter 1 according to Example 1.

The ΔΣ analog-to-digital converter 1 according to Example 1 uses a quantization circuit unit 12 that outputs a 1-bit digital signal and includes a splitter 14 at a stage after the quantization circuit unit 12. The splitter 14 divides a digital output of the comparator 121 constituting the quantization circuit unit 12 into an even-numbered digital value and an odd-numbered digital value.

The even-numbered digital value and the odd-numbered digital value divided by the splitter 14 are separately transmitted to the decimation filter 20 by two-system transmission paths, i.e., an even-number transmission path 30$_e$ and an odd-number transmission path 30$_o$. The even-number transmission path 30$_e$ and the odd-number transmission path 30$_o$ include a wiring only in some cases. However, as illustrated in FIG. 2, repeaters 40$_e$, 40$_o$ for signal relay are included in some cases, and alternatively a buffer flow flowing signal to a wiring is included in some cases.

The decimation filter 20 performs processing for obtaining high resolution by removing a high frequency quantization noise in an order before division by the splitter 14, with respect to the even-numbered digital value and the odd-numbered digital value transmitted by the even-number transmission path 30$_e$ and an odd-number transmission path 30$_o$.

The logic "0" of the digital data output from the ΔΣ modulator 10 is simply described as 0 and the logic "1" is simply described as 1 below. Then, a rate of a change of digital data from 0 to 1 or 1 to 0 is called a toggle rate.

For the output of the 1-bit ΔΣ modulator 10, the toggle rate is low when the input level of the ΔΣ analog-to-digital converter 1 is low or high, and the toggle rate is high when the input level is close to middle. The reason can be described as below. In other words, when the input level is low, 1 sometimes appears in many 0s, and when the input level is high, 0 sometimes appears in many 1s. Therefore, the toggle rate is low. Meanwhile, when the input level is middle, 0 and 1 are output substantially at equal numbers. However, because 0 and 1 are frequently switched by the work of the ΔΣ modulator 10 that causes the quantization noise to be unevenly distributed in high frequency, and therefore the toggle rate is high.

The power consumption of the transmission path 30 (30$_e$, 30$_o$) from the output of the ΔΣ modulator 10 to the decimation filter 20 increases when the length of the transmission path is long and the toggle rate is high. Thus, reducing the toggle rate at the time of middle input level enables a reduction in maximum power consumption when the length of the transmission path is long.

Here, there is a tendency that the possibility in which 0 and 1 are continuous is larger than the possibility in which 0 and 1 are switched with respect to the output of the ΔΣ modulator 10 at the time of middle input level. Therefore, the output data of the quantization circuit unit 12 is divided into the even-number transmission path 30$_e$ and the odd-number transmission path 30$_o$ by the splitter 14. Thus, the possibility in which 0 and 1 are continuous is smaller than the possibility in which 0 and 1 are switched in the transmission paths 30$_e$, 30$_o$. Accordingly, the toggle rate at the time of middle input level is reduced, reducing the maximum power consumption.

Figures 3A, 3B:
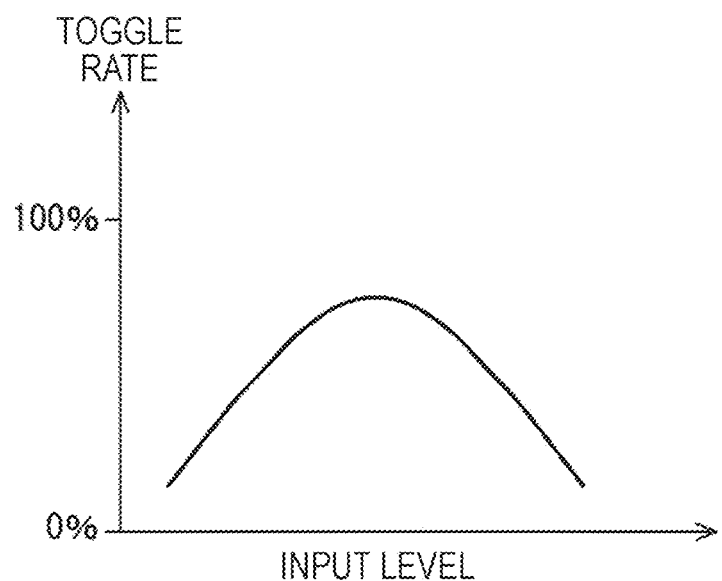
FIG. 3A is a diagram illustrating an example of output data of a ΔΣ modulator at a time of small input, middle input, and large input in the case of a circuit configuration of a basic form.
FIG. 3B is a diagram illustrating an input level dependency of a toggle rate.

FIG. 3A illustrates an example of output data of the ΔΣ modulator 10 at the time of small input, middle input, and large input in the case of the basic form in which the output data of the ΔΣ modulator 10 is transmitted to the decimation filter 20 by one-system transmission path 30. Furthermore, the input level dependency of the toggle rate is illustrated in FIG. 3B. It can be seen from these drawings that the toggle rate is increased at the time of middle input in a case where the output data of the ΔΣ modulator 10 is transmitted to the decimation filter 20 by the one-system transmission path 30.

Figures 4A, 4B:
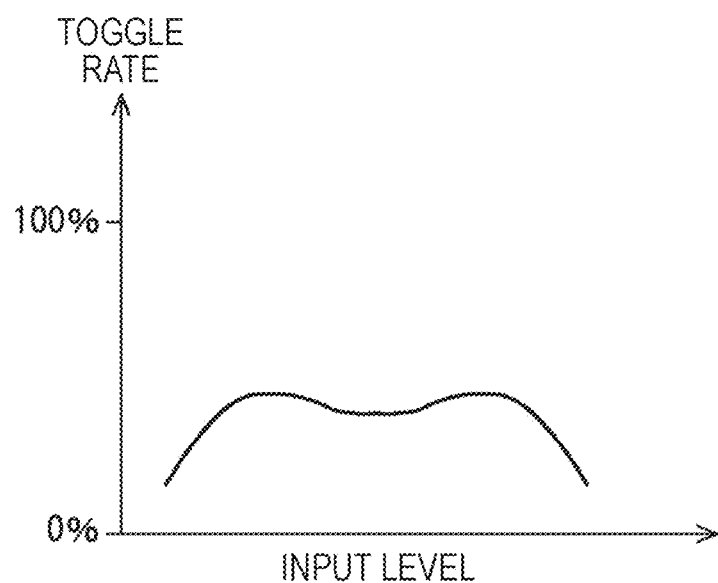
FIG. 4A is a diagram illustrating an example of output data of a ΔΣ modulator at a time of small input, middle input, and large input in the case of a circuit configuration of Example 1.
FIG. 4B is a diagram illustrating an input level dependency of a toggle rate.

FIG. 4A illustrates an example of output data of the ΔΣ modulator 10 at the time of small input, middle input, and large input in the case of Example 1 in which the output data of the ΔΣ modulator 10 is divided into the even-numbered digital value and the odd-numbered digital value and transmitted to the decimation filter 20 by the two-system transmission paths 30$_e$, 30$_o$. Furthermore, the input level dependency of the toggle rate is illustrated in FIG. 4B. It can be seen from these drawings that the toggle rate is reduced at the time of middle input in a case where the output data of the ΔΣ modulator 10 is transmitted to the decimation filter 20 by the two-system transmission paths 30$_e$, 30$_o$.

As described above, according to Example 1, division into the even-numbered digital value and the odd-numbered digital value reduces the rate of change of digital data from 0 to 1 or 1 to 0 in the transmission paths $30_e$, $30_o$ from the ΔΣ modulator 10 to the decimation filter 20, enabling a reduction in power consumption. Furthermore, dividing the data into even numbered data and odd numbered data halves the data rate of the transmission paths $30_e$, $30_o$, and therefore it becomes easy to take a timing margin for delivery of signal from the ΔΣ modulator 10 to the decimation filter 20.

Example 2

Example 2 is an example of a case of having a multi-bit ΔΣ modulator. FIG. 5 is a block diagram illustrating a circuit configuration of the ΔΣ analog-to-digital converter 1 according to Example 2.

In the case of the multi-bit ΔΣ modulator 10, the quantization circuit unit 12 includes a plurality of comparators 121 and outputs bits digital data, and the digital data transmitted to the decimation filter 20 becomes bits. Also in the ΔΣ analog-to-digital converter 1 according to Example 2 using the multi-bit ΔΣ modulator 10, the even-number transmission path $30_e$ and the odd-number transmission path $30_o$ are provided with respect to each output wiring to divide the transmission data. Thus, similar to the case of Example 1, it is possible to obtain a power consumption reduction effect.

Figure 6:
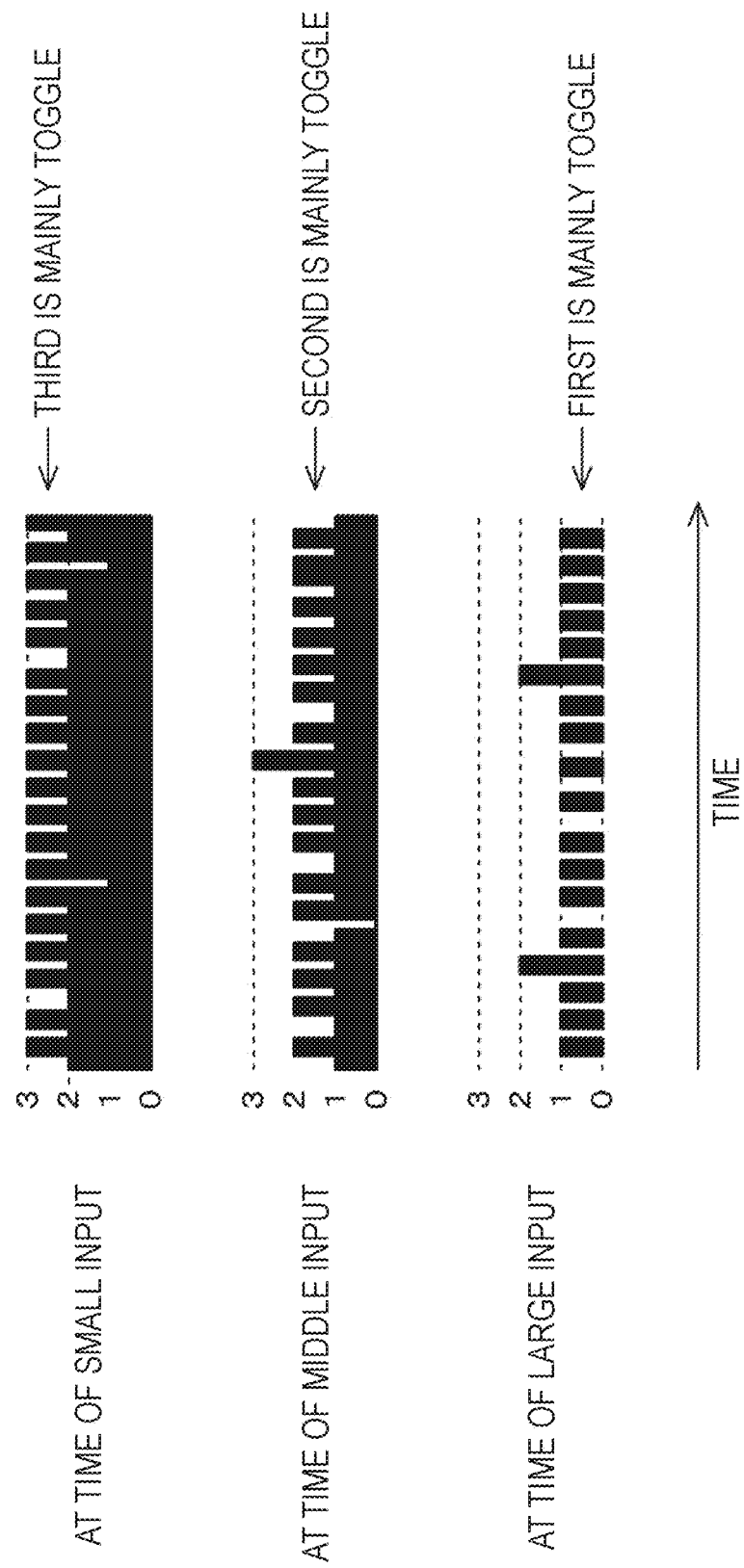
FIG. 6 is a diagram illustrating an example of output of a quantization circuit unit in the case of a 2-bit ΔΣ modulator.

In an Mbit ΔΣ modulator, the output of the quantization circuit unit 12 is output onto an $N(=2^M-1)$ wirings in the form of thermometer code. FIG. 6 illustrates an example of output of the quantization circuit unit 12 in the case of a 2-bit ΔΣ modulator. In this case, because of two bits, the number of output wirings of the quantization circuit unit 12 of a thermometer code is three.

As can be seen from FIG. 6, although a portion that can be toggled varies with input level, when attention is drawn to each output wiring of the quantization circuit unit 12, digital data having 0/1 pattern similar to the case of the 1-bit ΔΣ modulator is output. Accordingly an operation and effect similar to the case of the 1-bit ΔΣ modulator can be obtained. In other words, it is possible to reduce power consumption because a rate of change of digital data from 0 to 1 or 1 to 0 is reduced in the transmission paths $30_e$, $30_o$ from the ΔΣ modulator 10 to the decimation filter 20. Furthermore, dividing the data into even numbered data and odd numbered data halves the data rate of the transmission paths $30_e$, $30_o$, and therefore it becomes easy to take a timing margin for delivery of signal from the ΔΣ modulator 10 to the decimation filter 20.

Example 3

Figure 7:
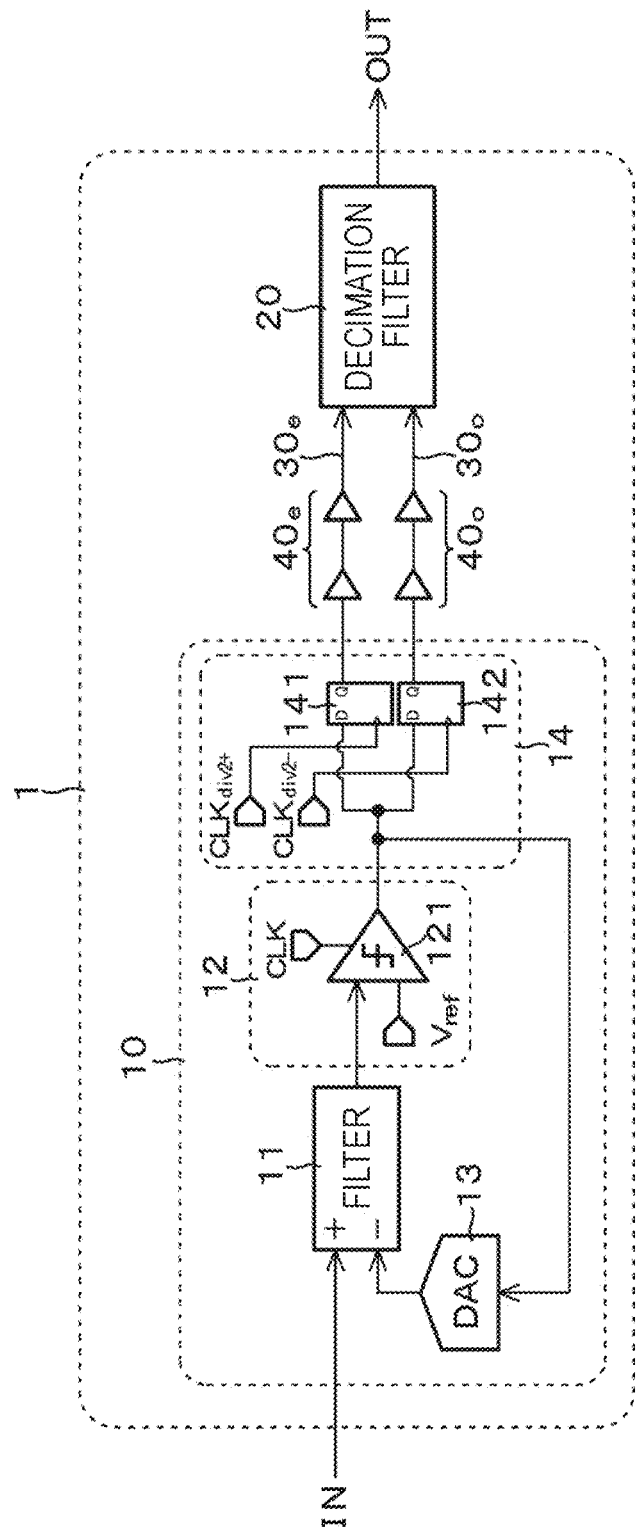
FIG. 7 is a block diagram illustrating a circuit configuration of a ΔΣ analog-to-digital converter according to Example 3.
Figure 8:
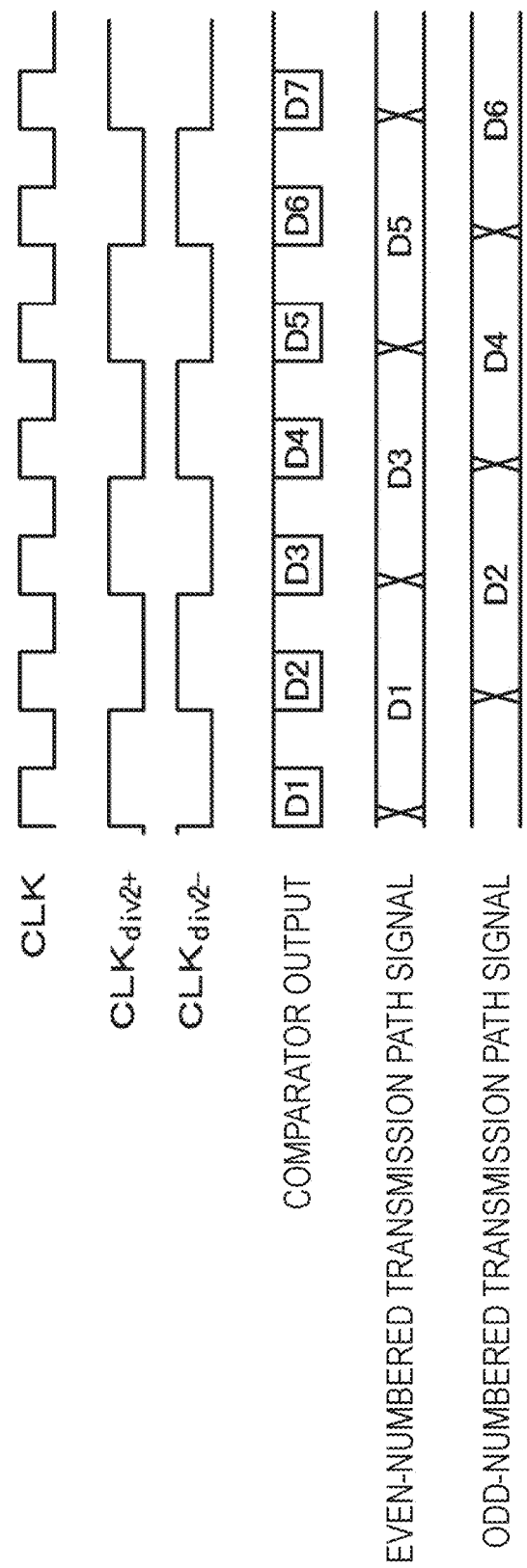
FIG. 8 is a timing waveform diagram illustrating a waveform of each unit of the ΔΣ analog-to-digital converter according to Example 3.

Example 3 is a variation of Example 1 and relates to a specific circuit example 1 of the splitter 14 that divides a digital output of the comparator 121 constituting the quantization circuit unit 12 into an even-numbered digital value and an odd-numbered digital value. FIG. 7 illustrates a circuit configuration of the ΔΣ analog-to-digital converter 1 according to Example 3, and FIG. 8 illustrates waveforms of each unit of the ΔΣ analog-to-digital converter according to Example 3.

In FIG. 7, the comparator 121 constituting the quantization circuit unit 12 quantizes the output of the filter 11 in comparison with a reference voltage $V_{ref}$ in synchronization with a clock signal CLK. The splitter 14 includes two D-FFs (flip flops) 141, 142.

The D-FF 141 sets a digital output of the comparator 121 to a D input and sets a clock signal $CLK_{div2+}$, which is a ½ frequency (twice cycles) of the clock signal CLK, which is a reference of operation of the comparator 121, to a clock input. Then, the output of the D-FF 141 is derived as an even-numbered digital value and transmitted to the decimation filter 20 by the even-number transmission path $30_e$.

The D-FF 142 sets a digital output of the comparator 121 to a D input and sets a clock signal $CLK_{div2-}$, which is an opposite phase of the clock signal $CLK_{div2+}$, to a clock input. Then, the output of the D-FF 142 is derived as an odd-numbered digital value and transmitted to the decimation filter 20 by the odd-number transmission path $30_o$.

FIG. 8 illustrates waveforms of the clock signal CLK, a positive-phase clock signal $CLK_{div2+}$, an opposite-phase clock signal $CLK_{div2-}$, an output of the comparator 121, a signal transmitted by the even-number transmission path $30_e$ (even-number transmission path signal), and a signal transmitted by the odd-number transmission path $30_o$ (odd-number transmission path signal).

As described above, according to Example 3, when the splitter 14 is configured using the D-FFs 141, 142, the digital output of the comparator 121 can be divided into an even-numbered digital value and an odd-numbered digital value.

Here, regarding Example 3, description is given of the case of application to Example 1 in a case of having a 1-bit ΔΣ modulator by way of example. However, application may similarly be made to Example 2 in a case of having a multi-bit ΔΣ modulator.

Example 4

Figure 9:
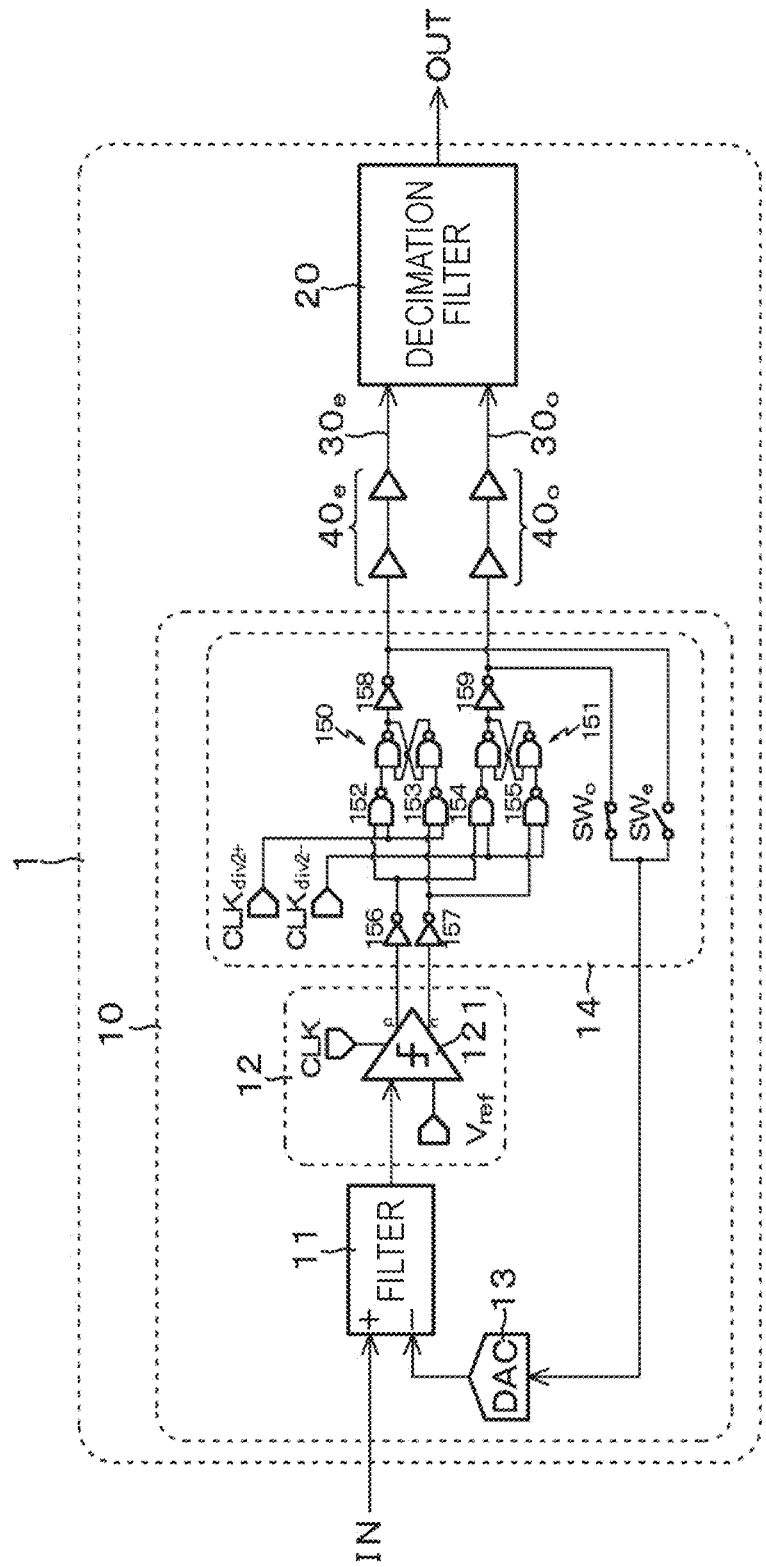
FIG. 9 is a block diagram illustrating a circuit configuration of a ΔΣ analog-to-digital converter according to Example 4.
Figure 10:
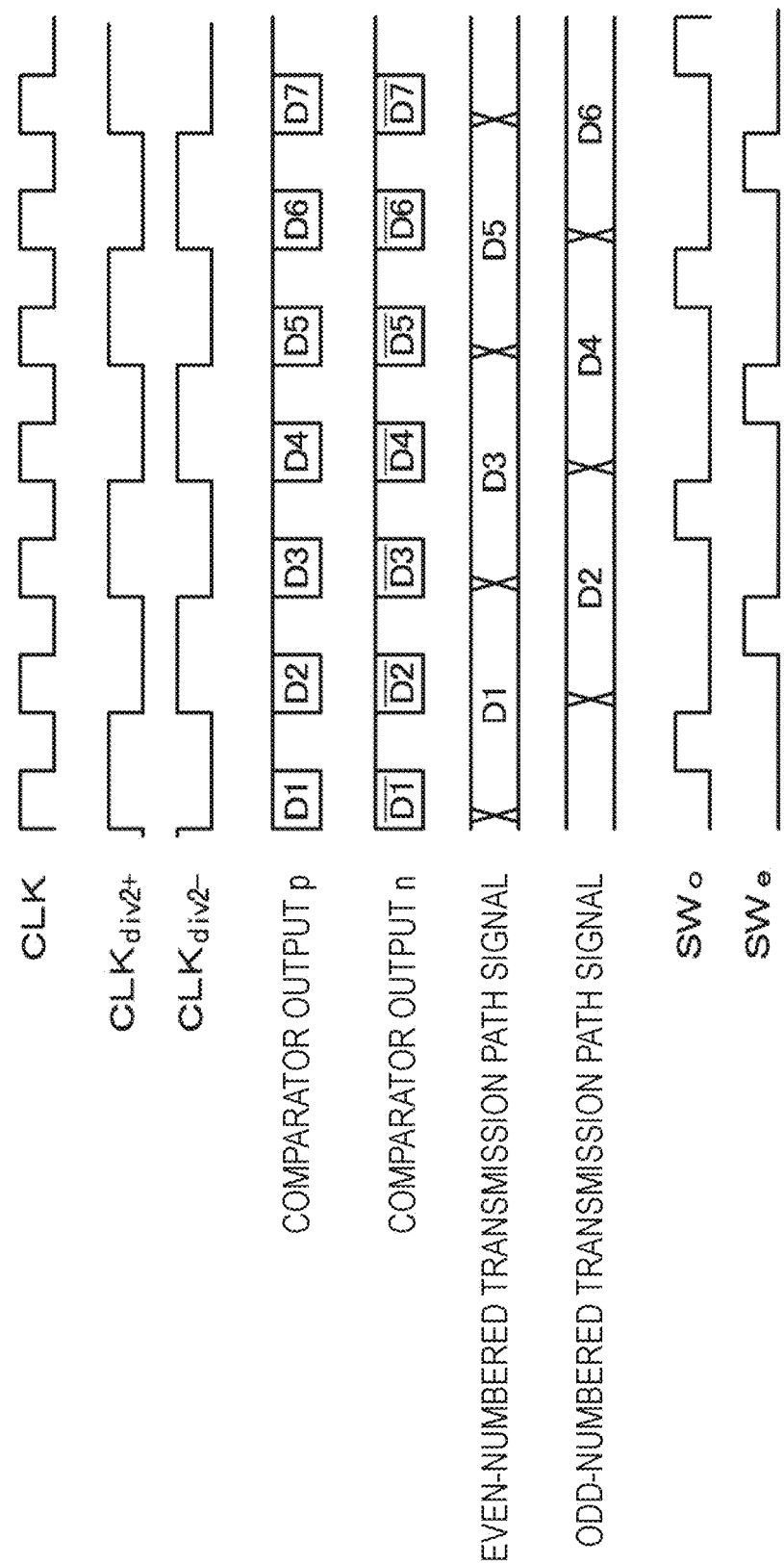
FIG. 10 is a timing waveform diagram illustrating a waveform of each unit of the ΔΣ analog-to-digital converter according to Example 4.

Example 4 is a variation of Example 1 and relates to a specific circuit example 2 of the splitter 14 that divides a digital output of the comparator 121 constituting the quantization circuit unit 12 into an even-numbered digital value and an odd-numbered digital value. FIG. 9 illustrates a circuit configuration of the ΔΣ analog-to-digital converter 1 according to Example 4, and FIG. 10 illustrates waveforms of each unit of the ΔΣ analog-to-digital converter 1 according to Example 4.

In FIG. 9, the comparator 121 constituting the quantization circuit unit 12 feeds a positive-phase digital output p and an opposite-phase digital output n to the splitter 14. The splitter 14 includes two RS-FFs (flip flops) 150, 151, four NAND circuits 152 to 155, and four inverter circuits 156 to 159.

The positive-phase digital output p of the comparator 121 is an input of one of the NAND circuits 152, 154 via the inverter circuit 156, and the opposite-phase digital output n is an input of one of the NAND circuits 153, 155 via the inverter circuit 157. The NAND circuits 152, 153 set the clock signal $CLK_{div2+}$, which is ½ frequency of the clock signal CLK, to an input of the other. The NAND circuits 154, 155 set the clock signal $CLK_{div2-}$, which is the opposite phase of the clock signal $CLK_{div2+}$, to an input of the other.

The output of the NAND circuit 152 is an S input of the RS-FF 150. The output of the NAND circuit 153 is an R input of the RS-FF 150. Then, a Q output of the RS-FF 150 is derived as an even-numbered digital value and transmitted to the decimation filter 20 by the even-number transmission path $30_e$ and fed to the digital-to-analog conversion unit 13 via a switch $SW_o$.

The output of the NAND circuit 154 is an S input of the RS-FF 151. The output of the NAND circuit 155 is an R input of the RS-FF 151. Then, a Q output of the RS-FF 151 is derived as an odd-numbered digital value and transmitted to the decimation filter 20 by the odd-number transmission path $30_o$ and fed to the digital-to-analog conversion unit 13 via a switch $SW_e$.

FIG. 10 illustrates waveforms of the clock signal CLK, a positive-phase clock signal $CLK_{div2+}$, an opposite-phase clock signal $CLK_{div2-}$, the positive-phase digital output p of the comparator 121, the opposite-phase digital output n of the comparator 121, an even-numbered transmission path signal, an odd-numbered transmission path signal, control pulse of the switch $SW_o$, and control pulse of the switch $SW_e$.

As described above, according to Example 4, when the splitter 14 is configured using the RS-FFs 150, 151, the digital output of the comparator 121 can be divided into an even-numbered digital value and an odd-numbered digital value. As is well known, the circuit configuration of the RS-FF is very simpler than that of the D-FF. Accordingly, as compared with Example 3 constituting the splitter 14 using the D-FFs 141, 142, Example 4 constituting the splitter 14 using the RS-FFs 150, 151 is advantageous in that the circuit scale can be smaller.

Furthermore, in the ΔΣ analog-to-digital converter 1 according to Example 4, the digital output of the comparator 121 once divided into an even-numbered digital value and an odd-numbered digital value is re-combined by the operation of the switch $SW_o$ and the switch $SW_e$, and is fed back to the digital-to-analog conversion unit 13. In this way, even if a bit error occurs in the RS-FFs 150, 151, a filtering effect of ΔΣ loop is acted on the error. Therefore, influences of the bit error can be suppressed to an almost negligible level.

Here, regarding Example 4, description is given of the case of application to Example 1 in a case of having a 1-bit ΔΣ modulator by way of example. However, application may similarly be made to Example 2 in a case of having a multi-bit ΔΣ modulator.

Furthermore, a similar operation and effect can be obtained when the matter that the even-numbered digital value and the odd-numbered digital value are combined by the operation of the switch $SW_o$ and the switch $SW_e$, and fed back to the input side via the digital-to-analog conversion unit 13 is applied to Example 3.

<Solid-State Imaging Element of the Present Disclosure>
[Basic System Configuration]

Figure 11:
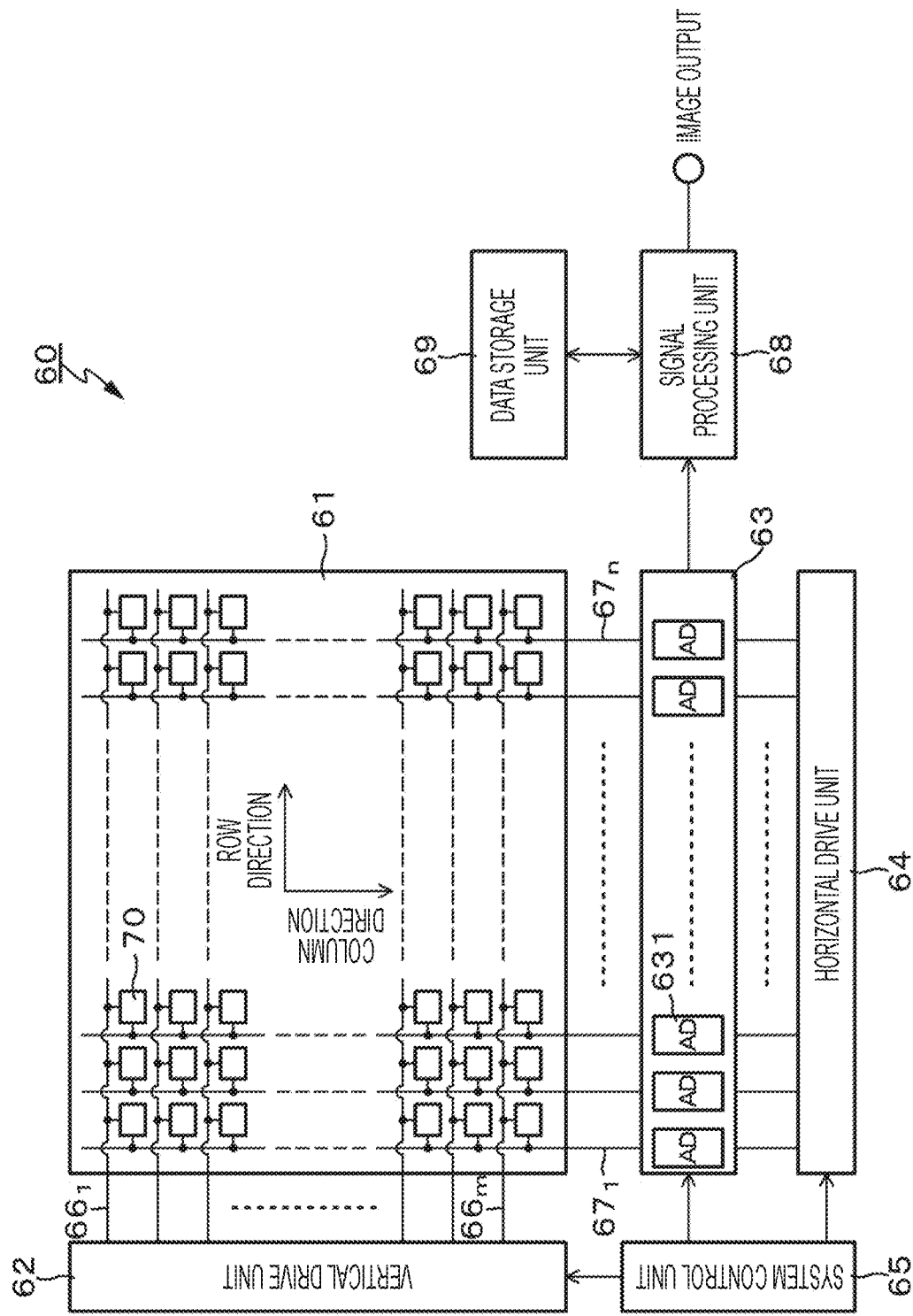
FIG. 11 is a schematic configurational diagram illustrating a basic system configuration of a solid-state imaging element of the present disclosure.

FIG. 11 is a schematic configurational diagram illustrating a basic system configuration of a solid-state imaging element of the present disclosure. Here, as the solid-state imaging element, description is given of a CMOS image sensor, which is one type of an X-Y address type solid-state imaging element by way of example. The CMOS image sensor is an image sensor that is generated by utilizing or partially using a CMOS process.

A CMOS image sensor 60 according to the present example includes a pixel array unit 61 formed on a semiconductor substrate, which is not illustrated, and a peripheral circuit unit integrated on the semiconductor substrate, which is the same as the semiconductor substrate where the pixel array unit 61 is provided. The peripheral circuit unit includes, for example, a vertical drive unit 62, a column processing unit 63, a horizontal drive unit 64, and a system control unit 65.

The CMOS image sensor 60 further includes a signal processing unit 68 and a data storage unit 69. The signal processing unit 68 and the data storage unit 69 may be mounted on the same substrate as the CMOS image sensor 60 or may be arranged on a substrate, which is different from the substrate of the CMOS image sensor 60. Furthermore, each processing of the signal processing unit 68 and the data storage unit 69 may be processing by an external signal processing unit provided on a substrate, which is different from the substrate of the CMOS image sensor 60, e.g., a digital signal processor (DSP) circuit or software.

The pixel array unit 61 has a configuration in which unit pixels (hereinafter, simply referred to as the "pixel" in some cases) 70 including a photoelectric conversion unit that performs photoelectric conversion and generates and accumulates photocharges corresponding to the amount of received light are arranged in a row direction and in a column direction, i.e., two-dimensionally in a row and column pattern. Here, the row direction indicates a pixel arrangement direction of a pixel row (i.e., a horizontal direction), and the column direction indicates a pixel arrangement direction of a pixel column (i.e., a vertical direction).

In the pixel array unit 61, a pixel drive line 66 ($66_1$ to $66_m$) is wired along the row direction with respect to each pixel row with regard to the pixel arrangement in the row and column pattern, and a vertical signal line 67 ($67_1$ to $67_n$) is wired along the column direction with respect to each pixel column. The pixel drive line 66 transmits a drive signal to be described later for performing driving in reading out a signal from the pixel. FIG. 11 illustrates one wiring as the pixel drive line 66, but the number is not limited to one. One end of the pixel drive line 66 is connected to an output end corresponding to each column of the vertical drive unit 62.

The vertical drive unit 62 includes a shift register, an address decoder, or the like, and drives each pixel 70 of the pixel array unit 61 simultaneously, in pixel units of columns, or the like. In other words, the vertical drive unit 62 constitutes a drive unit that drives each pixel 70 of the pixel array unit 61 together with a system control unit 65 that controls the vertical drive unit 62. An illustration of a specific configuration of the vertical drive unit 62 is omitted. However, in general, the vertical drive unit 62 includes two scanning systems: a read scanning system and a sweep scanning system.

The read scanning system selectively scans unit pixels 70 of the pixel array unit 61 in order in units of rows in order to read a signal from the unit pixels 70. The signal read from the unit pixels 70 is an analog signal. The sweep scanning system performs sweep scanning on a read column to which read scanning is performed by the read scanning system earlier than the read canning by time of shutter speed.

By the sweep scanning by the sweep scanning system, an unnecessary charge is swept from the photoelectric conversion unit of the unit pixel 70 in the read row and the photoelectric conversion unit is reset. Then, when the unnecessary charge is swept (reset) by the sweep scanning system, what is known as an electronic shutter operation is performed. Here, the electronic shutter operation refers to an operation in which photocharges of the photoelectric conversion unit is discarded and exposure is newly started (start of accumulation of photocharges).

A signal read by the read operation by the read scanning system corresponds to the amount of light received after the read operation immediately before or the electronic shutter operation. Then, a period from the read timing by the read operation immediately before or the sweep timing by the electronic shutter operation to the read timing by the present read operation is a period of exposure of photocharges in the unit pixel 70.

A signal output from each pixel 70 of the pixel row selectively scanned by the vertical drive unit 62 is input to the column processing unit 63 through each of vertical signal lines 67 for each pixel column.

A column processing unit 63 includes an analog-to-digital converter (AD converter) 631 that converts an analog pixel signal output from each pixel 70 in a selected row via the vertical signal line 67 into a digital signal with respect to each pixel column of the pixel array unit 61 or in units of a plurality of pixel columns. The column processing unit 63 may be configured to perform signal processing, e.g., denoise processing, in addition to AD conversion processing. As the denoise processing, for example, correlated double sampling (CDS) processing or double data sampling (DDS) processing can be exemplified. For example, by the CDS processing, reset noise or a pixel-specific fixed pattern noise, e.g., threshold variation of an amplifier transistor in the pixel 70 or the like can be removed.

The horizontal drive unit 64 includes a shift register, an address decoder, or the like, and selectively scans a unit circuit corresponding to one pixel column or a plurality of pixel columns of the column processing unit 63 in sequence. By selective scanning by the horizontal drive unit 64, pixel signals subjected to the signal processing, e.g., AD conversion, with respect to each unit circuit in the column processing unit 63 are output in sequence.

The system control unit 65 includes a timing generator that produces various types of timing signals or the like and performs drive control of the vertical drive unit 62, the column processing unit 63, the horizontal drive unit 64, or the like on the basis of various types of timings produced by the timing generator.

The signal processing unit 68 at least has an arithmetic processing function and performs various signal processing such as arithmetic processing on the pixel signal output from the column processing unit 63. For signal processing in the signal processing unit 68, the data storage unit 69 temporarily stores data required for the processing.

As the analog-to-digital converter 631 provided in the column processing unit 63 in the CMOS image sensor 60 having the aforementioned configuration with respect to each pixel column of the pixel array unit 61 or in units of a plurality of pixel columns, the $\Delta\Sigma$ analog-to-digital converter 1 according to Examples 1 to 4 described above can be used.

By the way, in the CMOS image sensor 60 including the analog-to-digital converter 631 with respect to each plurality of pixel columns of the pixel array unit 61 or in units of a plurality of pixel columns, in some cases a plurality of the $\Delta\Sigma$ modulators 10 and a plurality of the decimation filters 20 are arranged in the pixel column direction in order to achieve high-speed reading of the pixel signal.

Figure 12:
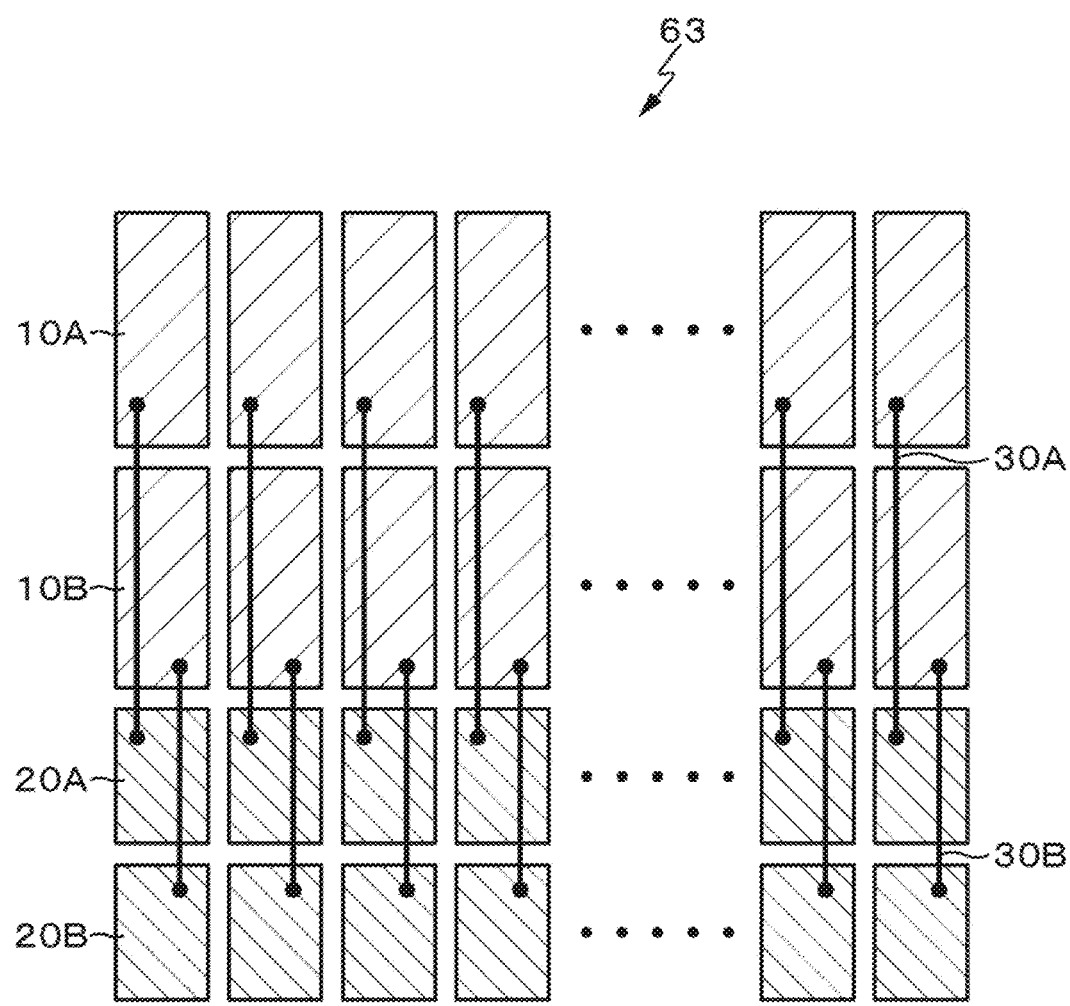
FIG. 12 is an arrangement diagram illustrating an example in which a plurality of ΔΣ modulators and a plurality of decimation filters are arranged in a pixel column direction.

In this case, a circuit unit belonging to the analog region and a circuit unit belonging to the digital region are preferably arranged separately. Here, an example of the case in which two $\Delta\Sigma$ modulators 10 and two decimation filters 20 are arranged in the pixel column direction is indicated. In this case, as illustrated in FIG. 12, the two $\Delta\Sigma$ modulators 10A, 10B belonging to the analog region are arranged up and down in the pixel column direction, and the two decimation filters 20A, 20B belonging to the digital region are arranged up and down in the pixel column direction.

In a case where the $\Delta\Sigma$ modulators 10A, 10B and the decimation filters 20A, 20B are arranged in the pixel column direction, the transmission path 30 is astride the $\Delta\Sigma$ modulator 10 and the decimation filter 20. Accordingly, the length of a transmission path 30A that links the $\Delta\Sigma$ modulator 10A and the decimation filter 20A and the length of a transmission path 30B that links the $\Delta\Sigma$ modulator 10B and the decimation filter 20B are long. Note that the transmission path 30A and the transmission path 30B includes two systems; however, here, they are illustrated to include one system for the sake of simplification of the drawing.

When the length of the transmission path 30 (30A, 30B) is long in this way, the consumption current at an output stage of the quantization circuit unit 12 and in the transmission path 30 significantly reflect the input level dependency of the $\Delta\Sigma$ analog-to-digital converter 1. Thus, an interference with another $\Delta\Sigma$ analog-to-digital converter 1 occurs via an IR drop of the power wiring, causing a deterioration in image quality, which is called streaking.

In contrast, in the CMOS image sensor 60 of the present disclosure, as the analog-to-digital converter 631 of the column processing unit 63, the $\Delta\Sigma$ analog-to-digital converter 1 according to Examples 1 to 4 is used. In other words, the output data of the $\Delta\Sigma$ modulator 10 is divided into the even-numbered digital value and the odd-numbered digital value and transmitted to the decimation filter 20 by the two-system transmission paths $30_e$, $30_o$ in the analog-to-digital converter 631 (i.e., the $\Delta\Sigma$ analog-to-digital converter 1).

Thus, it is possible to reduce power consumption because a rate of change of digital data from 0 to 1 or 1 to 0 is reduced in the transmission paths $30_e$, $30_o$ even in a case where the length of the transmission paths $30_e$, $30_o$ from the $\Delta\Sigma$ modulator 10 to the decimation filter 20 is long. Accordingly, it is possible to reduce the power consumption of the column processing unit 63 and eventually the power consumption of the entire CMOS image sensor 60. Furthermore, the consumption current of the transmission paths $30_e$, $30_o$ has small input level dependency of the $\Delta\Sigma$ analog-to-digital converter 1, and the Current consistency is increased. Thus, the deterioration in image quality, which is called streaking, is less likely to occur. Accordingly, a contribution can be made for positive adoption of the technology for high speed reading of pixel signal by arrangement of a plurality of the $\Delta\Sigma$ modulators 10 and a plurality of decimation filters 20 in the pixel column direction.

Note that, here, description is given of the case of the intended purpose of the CMOS image sensor 60 by way of example regarding the effect of reducing power consumption in a case where the length of the transmission path 30 that links the $\Delta\Sigma$ modulator 10 and the decimation filter 20 is long. However, an application may be made to the $\Delta\Sigma$ analog-to-digital converter for intended purposes other than the CMOS image sensor 60.

Furthermore, the system configuration of the CMOS image sensor 60 described above is an example, and is not limited to this system configuration. For example, the system configuration may be adopted in which the data storage unit 69 is arranged at a stage after the column processing unit 63 and the pixel signal output from the column processing unit 63 is fed to the signal processing unit 68 via the data storage unit 69. Alternatively, the system configuration may be adopted in which the data storage unit 69 and the signal processing unit 68 are provided in parallel with respect to the column processing unit 63.

[Layered Structure]

Figure 13:
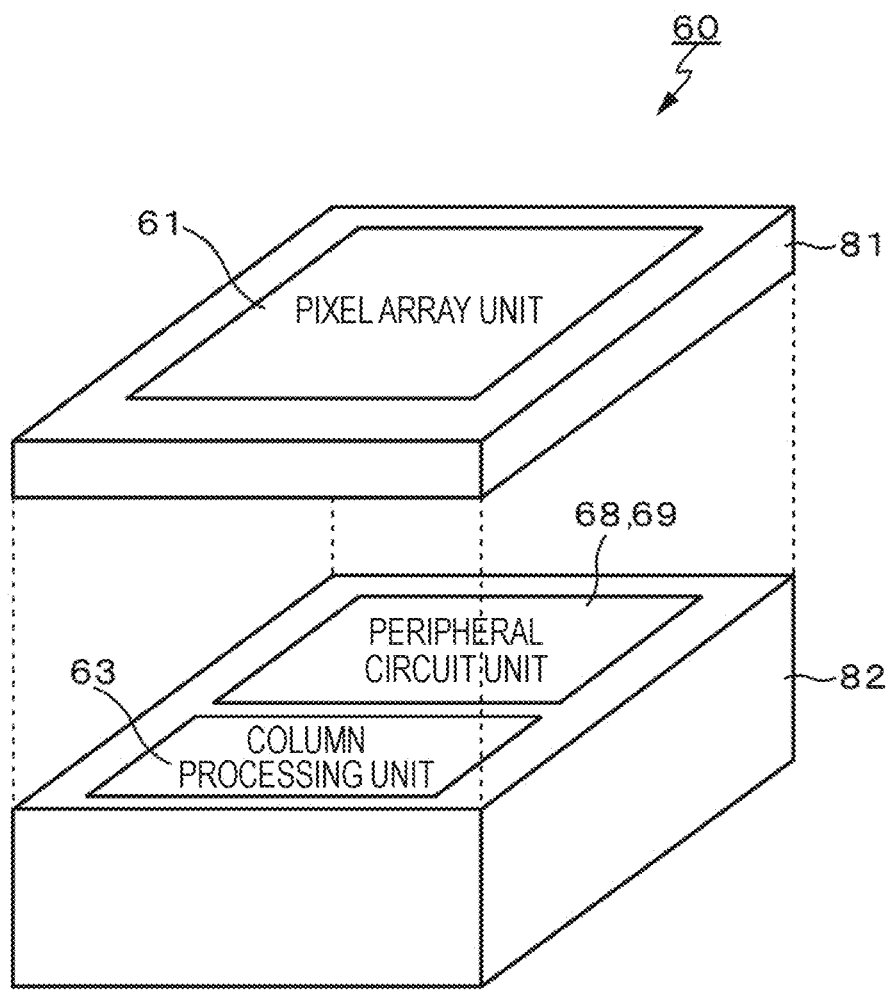
FIG. 13 is an exploded perspective diagram schematically illustrating a configuration of a CMOS image sensor having a layered structure.

Furthermore, for the aforementioned CMOS image sensor 60, description is given of the CMOS image sensor having a so-called horizontally placed structure by way of example in which the column processing unit 63 including the analog-to-digital converter 631 or the peripheral circuit unit including, e.g., the signal processing unit 68, are formed on the same semiconductor substrate as the pixel array unit 61, but it is not limited to the application to the CMOS image sensor having the horizontally placed structure. In other words, application may also be made to the CMOS image sensor having a so-called layered structure in which a plurality of semiconductor substrates are stacked with respect to each other. As one specific example of the layered structure, as illustrated, for example, in FIG. 13, a layered structure can be exemplified in which a semiconductor substrate 81 on which the pixel array unit 61 is formed and a semiconductor substrate 82 in which the column processing unit 63 including the analog-to-digital converter 631 and the peripheral circuit unit, e.g., the signal processing unit 68 or the data storage unit 69, are stacked.

With the CMOS image sensor 60 having the layered structure, it is sufficient if the semiconductor substrate 81, which is the first layer, has a size (area) for accommodating the pixel array unit 61. Therefore, it is possible to reduce the size (area) of the semiconductor substrate 81, which is the first layer, and eventually the size of the entire chip. Moreover, a process suitable for pixel formation can be applied to the semiconductor substrate 81, which is the first layer, and a process suitable for circuit formation can be applied to the semiconductor substrate 82, which is the second layer. Therefore, there is also a merit that the process can be optimized in manufacture of the CMOS image sensor 60.

Note that, here, a two-layered layered structure is exemplified, but it is not limited to two layers, but a layered structure having a three or more layers may be possible.

<Electronic Equipment of the Present Disclosure>

The aforementioned solid-state imaging element of the present disclosure can be used as an imaging unit (image capture unit) in an imaging apparatus, e.g., a digital still camera or a video camera, a portable terminal apparatus having an imaging function, e.g., a portable phone, and a general electronic equipment, e.g., a copying machine using a solid-state imaging element in an image read unit. Note that the solid-state imaging element may be in a form of being formed as one chip or may be in a module form having an imaging function in which an imaging unit and a signal processing unit or an optical system are collectively packaged. In some cases, the aforementioned module form mounted on electronic equipment, i.e., a camera module, is an imaging apparatus.

[Imaging Apparatus]

Figure 14:
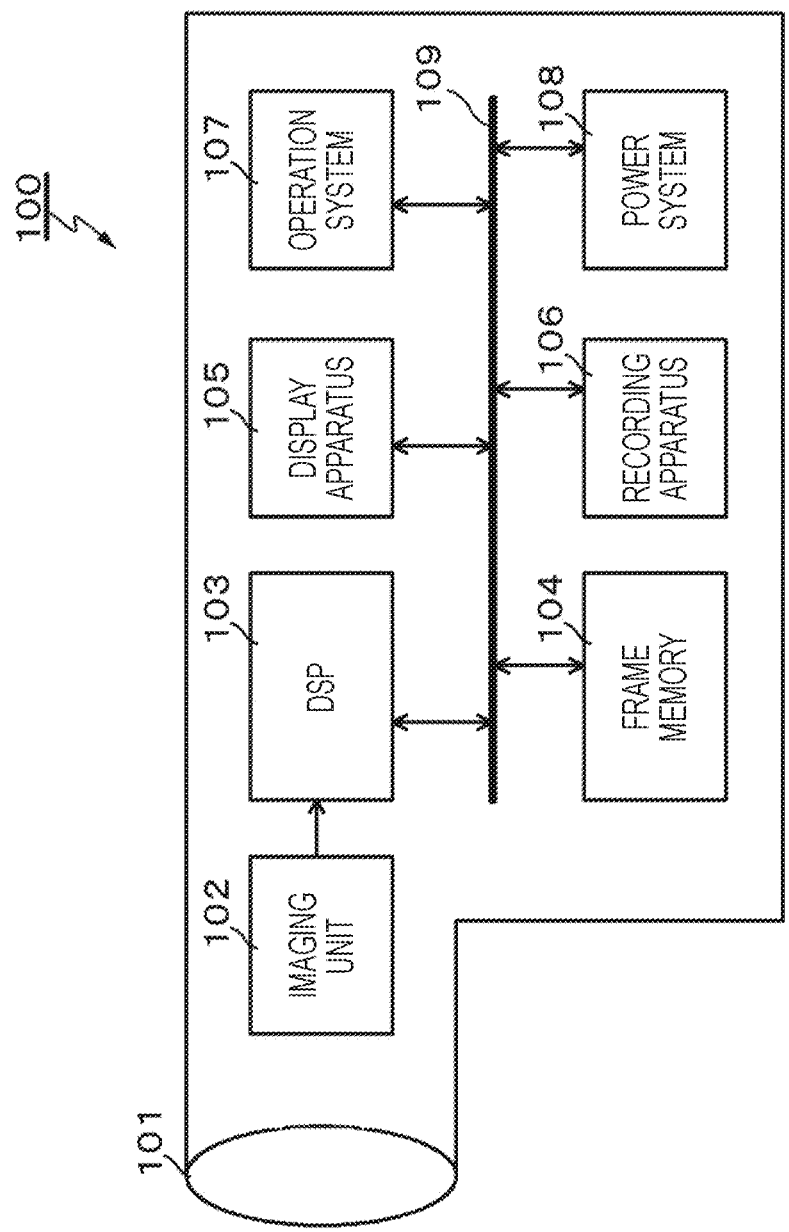
FIG. 14 is a block diagram illustrating a configuration of an imaging apparatus, which is an example of electronic equipment of the present disclosure.

FIG. 14 is a block diagram illustrating a configuration of an imaging apparatus, which is an example of electronic equipment of the present disclosure. As illustrated in FIG. 14, an imaging apparatus 100 according to the present example includes, an imaging optical system 101 including a lens group or the like, an imaging unit 102, a DSP circuit 103, a frame memory 104, a display apparatus 105, a recording apparatus 106, an operation system 107, a power system 108, and the like. Then, the DSP circuit 103, the frame memory 104, the display apparatus 105, the recording apparatus 106, the operation system 107, and the power system 108 are configured to be mutually connected via a bus line 109.

The imaging optical system 101 takes in incident light (image light) from a subject and forms an image on an imaging surface of the imaging unit 102. The imaging unit 102 converts the amount of incident light that forms an image on the imaging surface by the optical system 101 into an electric signal in units of pixel, and outputs the electric signal as a pixel signal. The DSP circuit 103 performs general camera signal processing, e.g., white balance processing, demosaicing processing, or gamma correction processing.

The frame memory 104 is used for storage of data as appropriate in a process of the signal processing in the DSP circuit 103. The display apparatus 105 includes a panel-type display apparatus, e.g., a liquid crystal display apparatus or an organic electro luminescence (EL) display apparatus, and displays a moving image or a still image captured by the imaging unit 102. The recording apparatus 106 records a moving image or a still image captured by the imaging unit 102 on a recording medium, e.g., a portable semiconductor memory, an optical disk, or a hard disk drive (HDD).

The operation system 107 issues an operation instructions with respect to various functions of the present imaging apparatus 100 under a user's operation. The power system 108 appropriately feeds various power sources, which are operation power for the DSP circuit 103, the frame memory 104, the display apparatus 105, the recording apparatus 106, and the operation system 107, to these feed targets.

In the imaging apparatus 100 with the aforementioned configuration, the aforementioned CMOS image sensor 60 according to the present disclosure can be used as the imaging unit 102. The CMOS image sensor 60 according to the present disclosure can reduce the power consumption in the ΔΣ analog-to-digital converter 1 even in a case where the transmission path 30 that links the ΔΣ modulator 10 and the decimation filter 20 is long. Accordingly, when the CMOS image sensor 60 according to the present disclosure is used as the imaging unit 102, the low power consumption can be achieved even if a plurality of the ΔΣ modulators 10 and a plurality of the decimation filters 20 are arranged in the pixel column direction in order to achieve high speed reading of the pixel signal.

<Configuration that can be Adopted by the Present Disclosure>

Note that the present disclosure may adopt the configuration described below.

<<A. Analog-to-Digital Converter>>

[A-1] An analog-to-digital converter including:

a ΔΣ modulator including a quantization circuit unit;

a splitter that divides a digital output of the quantization circuit unit into an even-numbered digital value and an odd-numbered digital value;

two-system transmission paths that transmit the even-numbered digital value and the odd-numbered digital value separately; and a digital filter that processes the even-numbered digital value and the odd-numbered digital value transmitted by the two-system transmission paths, and outputs the even-numbered digital value and the odd-numbered digital value as an analog-to-digital conversion value.

[A-2] The analog-to-digital converter according to [A-1], in which the ΔΣ modulator is a 1-bit ΔΣ modulator.

[A-3] The analog-to-digital converter according to [A-1], in which the ΔΣ modulator is a multi-bit ΔΣ modulator.

[A-4] The analog-to-digital converter according to any of [A-1] to [A-3], in which the splitter is configured using a D-flip flop.

[A-5] The analog-to-digital converter according to any of [A-1] to [A-3], in which the splitter is configured using an RS-flip flop.

[A-6] The analog-to-digital converter according to [A-4] or [A-5], in which the even-numbered digital value and the odd-numbered digital value are combined and fed back to an input side via a digital-to-analog conversion unit.

<<B. Solid-State Imaging Element>>

[B-1] A solid-state imaging element comprising:

a pixel array unit including unit pixels including a photoelectric conversion unit arranged in a row and column pattern; and a column processing unit including an analog-to-digital converter that converts an analog pixel signal output from the unit pixel into a digital pixel signal,
  in which the analog-to-digital converter includes:
    a ΔΣ modulator including a quantization circuit unit;
    a splitter that divides a digital output of the quantization circuit unit into an even-numbered digital value and an odd-numbered digital value;
    two-system transmission paths that transmit the even-numbered digital value and the odd-numbered digital value separately; and
    a digital filter that processes the even-numbered digital value and the odd-numbered digital value transmitted by the two-system transmission paths, and outputs the even-numbered digital value and the odd-numbered digital value as an analog-to-digital conversion value.

[B-2] The solid-state imaging element according to [B-1],
  in which a plurality of the ΔΣ modulators and a plurality of the digital filters are arranged in a pixel column direction in the column processing unit.

[B-3] The solid-state imaging element according to [B-1] or [B-2],
  in which the ΔΣ modulator is a 1-bit ΔΣ modulator.

[B-4] The solid-state imaging element according to [B-1] or [B-2],
  in which the ΔΣ modulator is a multi-bit ΔΣ modulator.

[B-5] The solid-state imaging element according to any of [B-1] to [B-4],
  in which the splitter is configured using a D-flip flop.

[B-6] The solid-state imaging element according to any of [B-1] to [B-4],
  in which the splitter is configured using an RS-flip flop.

[B-7] The solid-state imaging element according to [B-5] or [B-6],
  in which the even-numbered digital value and the odd-numbered digital value are combined and fed back to an input side via a digital-to-analog conversion unit.

<<C. Electronic Equipment>>

[C-1] Electronic equipment comprising a solid-state imaging element including:
  a pixel array unit including unit pixels including a photoelectric conversion unit arranged in a row and column pattern; and
  a column processing unit including an analog-to-digital converter that converts an analog pixel signal output from the unit pixel into a digital pixel signal,
  in which the analog-to-digital converter includes:
    a ΔΣ modulator including a quantization circuit unit;
    a splitter that divides a digital output of the quantization circuit unit into an even-numbered digital value and an odd-numbered digital value;
    two-system transmission paths that transmit the even-numbered digital value and the odd-numbered digital value separately; and
    a digital filter that processes the even-numbered digital value and the odd-numbered digital value transmitted by the two-system transmission paths, and outputs the even-numbered digital value and the odd-numbered digital value as an analog-to-digital conversion value.

[C-2] The electronic equipment according to [C-1],
  in which a plurality of the ΔΣ modulators and a plurality of the digital filters are arranged in a pixel column direction in the column processing unit.

[C-3] The electronic equipment according to [C-1] or [C-2],
  in which the ΔΣ modulator is a 1-bit ΔΣ modulator.

[C-4] The electronic equipment according to [C-1] or [C-2],
  in which the ΔΣ modulator is a multi-bit ΔΣ modulator.

[C-5] The electronic equipment according to any of [C-1] to [C-4],
  in which the splitter is configured using a D-flip flop.

[C-6] The electronic equipment according to any of [C-1] to [C-4],
  in which the splitter is configured using an RS-flip flop.

[C-7] The electronic equipment according to [C-5] or [C-6],
  in which the even-numbered digital value and the odd-numbered digital value are combined and fed back to an input side via a digital-to-analog conversion unit.

REFERENCE SIGNS LIST

1 ΔΣ analog-to-digital converter (AD converter)
10, 10A, 10B ΔΣ modulator
11 Filter
12 Quantization circuit unit
13 Digital-to-analog conversion unit (DA converter)
14 Splitter
20, 20A, 20B Decimation filter
30($30_o$, $30_e$) Transmission path
60 CMOS image sensor
61 Pixel array unit
62 Vertical drive unit
63 Column processing unit
64 Horizontal drive unit
65 System control unit
66($66_1$ to $66_m$) Pixel drive line
67($67_1$ to $17_n$) Vertical signal line
68 Signal processing unit
69 Data storage unit
70 Unit pixel
141, 142 D-flip flop
150, 151 RS-flip flop

The invention claimed is:
1. An analog-to-digital converter comprising:
  a ΔΣ modulator including a quantization circuit unit;
  a splitter that divides a digital output of the quantization circuit unit into an even-numbered digital value and an odd-numbered digital value;
  two-system transmission paths, including a first transmission path that transmits the even-numbered digital value and a second transmission path that transmits the odd-numbered digital value; and
  a digital filter that processes the even-numbered digital value and the odd-numbered digital value transmitted by the two-system transmission paths, and outputs an analog-to-digital conversion value based on the even-numbered digital value and the odd-numbered digital value.

2. The analog-to-digital converter according to claim 1, wherein the ΔΣ modulator is a 1-bit ΔΣ modulator.

3. The analog-to-digital converter according to claim 1, wherein the ΔΣ modulator is a multi-bit ΔΣ modulator.

4. The analog-to-digital converter according to claim 1, wherein the splitter is configured using a D-flip flop.

5. The analog-to-digital converter according to claim 1, wherein the splitter is configured using an RS-flip flop.

6. The analog-to-digital converter according to claim 5, wherein the even-numbered digital value and the odd-numbered digital value are combined and fed back to an input side via a digital-to-analog conversion unit.

7. A solid-state imaging element comprising:
a pixel array unit including unit pixels including a photoelectric conversion unit arranged in a row and column pattern; and
a column processing unit including an analog-to-digital converter that converts an analog pixel signal output from the unit pixel into a digital pixel signal,
wherein the analog-to-digital converter includes:
a ΔΣ modulator including a quantization circuit unit;
a splitter that divides a digital output of the quantization circuit unit into an even-numbered digital value and an odd-numbered digital value;
two-system transmission paths, including a first transmission path that transmits the even-numbered digital value and a second transmission path that transmits the odd-numbered digital value; and
a digital filter that processes the even-numbered digital value and the odd-numbered digital value transmitted by the two-system transmission paths, and outputs an analog-to-digital conversion value based on the even-numbered digital value and the odd-numbered digital value.

8. The solid-state imaging element according to claim 7, wherein a plurality of the ΔΣ modulators and a plurality of the digital filters are arranged in a pixel column direction in the column processing unit.

9. The solid-state imaging element according to claim 7, wherein the ΔΣ modulator is a 1-bit ΔΣ modulator.

10. The solid-state imaging element according to claim 7, wherein the ΔΣ modulator is a multi-bit ΔΣ modulator.

11. The solid-state imaging element according to claim 7, wherein the splitter is configured using a D-flip flop.

12. The solid-state imaging element according to claim 7, wherein the splitter is configured using an RS-flip flop.

13. The solid-state imaging element according to claim 12, wherein the even-numbered digital value and the odd-numbered digital value are combined and fed back to an input side via a digital-to-analog conversion unit.

14. Electronic equipment comprising a solid-state imaging element including:
a pixel array unit including unit pixels including a photoelectric conversion unit arranged in a row and column pattern; and
a column processing unit including an analog-to-digital converter that converts an analog pixel signal output from the unit pixel into a digital pixel signal,
wherein the analog-to-digital converter includes:
a ΔΣ modulator including a quantization circuit unit;
a splitter that divides a digital output of the quantization circuit unit into an even-numbered digital value and an odd-numbered digital value;
two-system transmission paths, including a first transmission path that transmits the even-numbered digital value and a second transmission path that transmits the odd-numbered digital value; and
a digital filter that processes the even-numbered digital value and the odd-numbered digital value transmitted by the two-system transmission paths, and outputs an analog-to-digital conversion value based on the even-numbered digital value and the odd-numbered digital value.

15. The electronic equipment according to claim 14, wherein a plurality of the ΔΣ modulators and a plurality of the digital filters are arranged in a pixel column direction in the column processing unit.

16. The electronic equipment according to claim 14, wherein the ΔΣ modulator is a 1-bit ΔΣ modulator.

17. The electronic equipment according to claim 14, wherein the ΔΣ modulator is a multi-bit ΔΣ modulator.

18. The electronic equipment according to claim 14, wherein the splitter is configured using a D-flip flop.

19. The electronic equipment according to claim 14, wherein the splitter is configured using an RS-flip flop.

20. The electronic equipment according to claim 19, wherein the even-numbered digital value and the odd-numbered digital value are combined and fed back to an input side via a digital-to-analog conversion unit.

* * * * *